United States Patent
Clementi et al.

(10) Patent No.: US 7,125,808 B2
(45) Date of Patent: Oct. 24, 2006

(54) METHOD FOR MANUFACTURING NON-VOLATILE MEMORY CELLS ON A SEMICONDUCTOR SUBSTRATE

(75) Inventors: Cesare Clementi, Busto Arisizio (IT); Alessia Pavan, Merate (IT); Livio Baldi, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 121 days.

(21) Appl. No.: 10/749,020

(22) Filed: Dec. 29, 2003

(65) Prior Publication Data

US 2004/0209472 A1 Oct. 21, 2004

(30) Foreign Application Priority Data

Dec. 30, 2002 (IT) .................. MI2002A2784

(51) Int. Cl.
*H01L 21/302* (2006.01)
*H01B 13/00* (2006.01)

(52) U.S. Cl. .............. 438/719; 438/257; 438/692; 438/723; 438/724; 216/13

(58) Field of Classification Search .............. None
See application file for complete search history.

(56) References Cited

U.S. PATENT DOCUMENTS

| | | | |
|---|---|---|---|
| 5,310,693 A * | 5/1994 | Hsue | 438/262 |
| 5,510,286 A * | 4/1996 | Kim | 438/637 |
| 5,688,705 A * | 11/1997 | Bergemont | 438/588 |
| 5,998,287 A * | 12/1999 | Huang | 438/587 |
| 6,027,972 A * | 2/2000 | Kerber | 438/257 |
| 6,624,027 B1 * | 9/2003 | Daemen et al. | 438/264 |
| 2004/0203250 A1 * | 10/2004 | Clementi et al. | 438/727 |

FOREIGN PATENT DOCUMENTS

| | | |
|---|---|---|
| EP | 1 361 603 | 11/2003 |
| EP | 1 387 395 | 2/2004 |

OTHER PUBLICATIONS

Wolf et al., Silicon Processing for the VLSI Era, 1986, Lattice Press, vol. 1, pp. 182-183, 175, 191, 407-408.*
Streetman, Solid State Electronic Devices, 1990, Prentice Hall, 3rd ed., p. 332.*
Wolf, Silicon Processing for the VLSI Era, 2002, Lattice Press, vol. 4, pp. 322-323, 333-335.*

* cited by examiner

*Primary Examiner*—Shamim Ahmed
*Assistant Examiner*—Eric B. Chen
(74) *Attorney, Agent, or Firm*—Jenkens & Gilchrist, PC

(57) ABSTRACT

A method is described for manufacturing non-volatile memory cells on a semiconductive substrate having active areas bounded by portions of an insulating layer. A thin layer of tunnel oxide is formed and a first layer of conductive material is then deposited. A plurality of floating gate regions are defined by forming stripes of shielding material only above pairs of alternated active areas. Spacers of a selective material are defined with respect to the shielding material and of small width at will in the shelter of the side walls of the stripes thus defined. A shielding material is also deposited on the active areas which lacked it. The formation of the floating gate is completed by leaving the definition of the distance between the floating gate regions to the spacers.

20 Claims, 9 Drawing Sheets

METHOD FOR MANUFACTURING NON-VOLATILE MEMORY CELLS ON A SEMICONDUCTOR SUBSTRATE

PRIORITY CLAIM

The present application claims priority from Italian Application for Patent No. MI2002A002784 filed Dec. 30, 2002, the disclosure of which is hereby incorporated by reference.

BACKGROUND OF THE INVENTION

1. Technical Field of the Invention

The present invention relates to a non-volatile memory cell comprising dielectric layers at low dielectric constant.

Although not limited thereto, the invention relates, in particular, but not exclusively, to a non-volatile memory cell of the Flash type, comprising dielectric layers at low dielectric constant and the following description is made with reference to this field of application for convenience of explanation only.

2. Description of Related Art

As it is well known, the Flash EEPROM memory electronic devices integrated on semiconductor comprise a plurality of matrix organized non-volatile memory cells 1; i.e., the cells are organized in rows, called word lines WL, and columns, called bit lines BL as shown in FIG. 1a.

Each non-volatile cell 1 comprises a floating gate MOS transistor as shown in FIG. 1b. The floating gate region FG of the floating gate transistor is realized above the channel region CH realized in the semiconductor substrate 2 and it is separated from the latter by means of a thin tunnel oxide layer 3, whose thickness is between 6 and 12 nm. A control gate region CG is capacitively coupled to the floating gate region FG by means of a single dielectric layer 7 (e.g., an oxide) or by means of the superposition of several dielectric layers for example of the ONO (oxide/nitride/oxide) type.

FIGS. 1b and 1c also show an enlarged view of the sections on a vertical plane of a cell along the channel length L and width W.

The other regions of the transistor are the usual drain D, source S, and body terminals. Metallic electrodes are provided for contacting drain and source terminal with control gate region CG terminals in order to be able to apply pre-established voltage values to the memory cell 1.

The charge stored in the floating gate region FG determines the logic state of the cell 1 by modifying its voltage threshold: fundamental characteristic of the memory cell 1 is in fact that of having two states, one with low threshold voltage ("erased" cell) and one with high threshold voltage ("written" cell). The voltage is applied from outside the control gate region CG, but the electrode effectively controlling the channel state is the floating gate region FG.

The floating gate region FG voltage does not depend only on the control gate region CG voltage, but also on the source, drain and bulk potentials, according to this relation:

$$V_{FG} = \frac{Q_{FG}}{C_{TOT}} + \sum_{i=S,B,D,G} \alpha_i \cdot V_i$$

Where:

$$\alpha_i = C_i/C_{TOT} < 1 \quad C_{TOT} = \sum_{i=S,B,D,G} C_i$$

In the calculation of the capacitive relations the capacitors get close to capacitors having plane and parallel plates, so:

$$\alpha_G = \frac{C_G}{C_{TOT}} = \frac{1}{\left(1 + \frac{W}{W+A} \cdot \frac{t_{ONO}}{t_{ox}}\right)}$$

$$\alpha_{S,B,D} = \frac{C_{S,B,D}}{C_{TOT}} = \frac{\frac{L_{S,B,D}}{L}}{\left(1 + \frac{W+A}{W} \cdot \frac{t_{ox}}{t_{ONO}}\right)}$$

where: $Q_{fg}$=total charge stored in the FG; $C_{tot}$=total capacitance related to the FG, equal to the sum of the partial capacitances related to the i-th element; $\alpha_i$=capacitive coupling coefficient of the FG with the i-th element; $V_i$=voltage of the i-th element; A=total length of the superposition of FG and insulating oxide (FOX); $t_{ONO}$=thickness of the interpoly dielectric (7) $t_{ox}$=thickness of the tunnel oxide (3) $L_i$=efficient electric length of the superposition region of FG and i-th element, where i can assume the S=source, B=body, D=drain, G=gate and W=channel width values From these relations the importance of the form and of the profile of the floating gate region FG is understood. In particular, it becomes necessary that such region is extended on the field oxide FOX formed in the semiconductor substrate 2 in order to protrude therefrom forming gills indicated with "A" in FIG. 1c. The function of the gills A is that of making the capacitance between the two poly ($C_g$) predominant with respect to the others and of having the channel controlled by the control gate region CG. The size of the gill A further influences the gate capacitive coupling value ($\alpha_g$): a reduction of this parameter has a strong impact on the performance of the cell in terms of programming and erasing time.

The extension of the gill A is thus a critical parameter of the cell geometry. Another critical parameter is also that of the spacing size between two consecutive floating gate regions FG indicated with "H" in FIG. 1c.

A known method flow for realizing these Flash memory cells 1 integrated on a semiconductor substrate 2 is schematically shown in FIGS. 2–5. In these figures vertical section views are shown in a direction parallel to the "Word Lines".

This known method provides the formation in the substrate of a plurality of active areas wherein the memory cells will be realized being separated one another by portions of a field oxide layer FOX. On the substrate 2 a first dielectric layer 3 called "Tunnel Oxide" and a polycrystalline silicon layer 4 called POLY1 are then formed.

This polycrystalline silicon layer 4, whose thickness is of around 50–150 nm, is for example formed by means of LPCVD (Low Pressure Chemical Vapor Deposition). This polycrystalline silicon layer 4 is possibly doped in order to reduce its resistivity, e.g., with an implant of either phosphoric or arsenic or in situ by adding a suitable material, e.g., phosphine, to the deposition environment.

The method goes on with the definition of the layer 4 to realize a plurality of polycrystalline silicon stripes 5 parallel one another. These stripes 5 are separated and insulated from the substrate 2 by means of the oxide layer 3 as shown in FIG. 4.

In particular, in this step a layer 6 of photosensitive material called resist is deposited on the surface of the polycrystalline silicon layer 4 and it is exposed with a suitable radiation in predetermined areas non-protected by a mask. The portions of resist selectively exposed to the radiation have a removing speed higher than that of the non-exposed areas and so they can be removed by means of a chemical solution called developer (FIG. 3). After lithographic definition a dry etching of the polycrystalline silicon stripes 5 is performed to define the floating gate regions FG (FIG. 5).

After depositing an interpoly dielectric layer 7, the standard method flow continues with the definition of the "Word Lines" by forming a polycrystalline silicon layer 8 (called POLY2).

The "Word Lines" are then defined through a photolithographic method which provides the use of a resist mask so that these word lines are arranged perpendicularly with respect to the polysilicon stripes 5.

Although advantageous under many aspects, this method flow has several drawbacks. In fact, the lithographic transfer of the mask pattern is highly critical and it limits the reduction of the spacing between two consecutive polycrystalline silicon stripes 5.

A difficulty is that of solving structures of lower sizes with respect to the wave length used in the exposition (generally 248 nm or 193 nm). Moreover, the light transmitted through the photoresist layer is reflected from the substrate generating interference phenomena, which cause a degeneration of the pattern transferred from the mask. Normally, in order to reduce the amount of reflected radiation an anti-reflecting material (BARC) is used, which is deposited in the form of layer below the resist layer 6 and which is removed during the etching of the polycrystalline silicon stripes 5.

The interference phenomena causing the degeneration of the pattern transferred from the mask can be reduced also by depositing an oxide layer above the pblycrystalline silicon layer 4, which is then removed by means of a dry etching or a final etching solution (so-called "hard mask" method).

Different methods have been developed in the prior art with the aim of improving the pattern definition and thus reducing the spacing between consecutive floating gate regions.

A known method provides the use of a so-called "phase shift" (PSM) mask. This mask id provided with an added layer called phase-shifter, placed on the edges of the drawn structures, which allows to invert the phase of the light crossing it while, at the same time, it destructively interferes with the light crossing the uncovered areas. In this way the splitting of the thin stripes is increased. Even if this method allows to improve the lithographic definition of the floating gate region, it is quite complex and expensive to be implemented. Moreover, this method does not allow to realize openings in the polycrystalline silicon layer smaller than 140 nm +/−10 nm with the lithography 248 nm and smaller than 115 nm +/−10 nm with the lithography 193 nm, and it suffers from the lack of a suitable level of control and intra-die and intra-wafer repeatability.

Another known method is the definition of structures having controlled size, such as for example spacers similar to those used in the definition of the transistors of the LDD type in a sacrificial material (or more suitably in a combination of sacrificial materials) deposited above the polycrystalline silicon layer (POLY1) to be defined to form the floating gate region. By aligning the etching with these spacers smaller sizes than those allowed by the lithography are obtained. After defining the floating gate region, the method flow goes on with the formation of the interpoly dielectric, which allows the sealing of the POLY1, and of a second polycrystalline silicon layer, called POLY2. The cell is then defined by means of standard etching and photolithography techniques.

However, this method has the drawbacks of a lack of repeatability of the desired size of the spacers in all the areas of the die and on the whole wafer, and of a high faultiness inevitably due to the long sequence of depositions and etchings necessary first to define the above cited sacrificial spacers and then to remove them together with all the other layers different from the polycrystalline silicon layer constituting the floating gate region.

Another known method—which recalls the preceding one—for reducing the spacing size between consecutive floating gate regions exploits the polimerization properties of the etching chemical materials. In accordance with this method, an organic material is deposited below a photosensitive resin, which is exposed with a suitable radiation in the presence of a conventional mask in order to define the floating gate regions. Then the organic material is etched by using a very polimerizing chemistry in order to form a sort of spacer of polymer along the walls of the organic material itself and so, aligning with said spacer, the polycrystalline silicon is subsequently etched, in order to repeatably define a poly-poly spacing of smaller sizes with respect to the lithographic ones. However, this method has several drawbacks linked to its essential polimerizing step. In particular, the polimerization is such as to leave working residues that, especially in case much smaller sizes are realized with than those obtainable by means of lithography, then they can cause short-circuits between adjacent floating gate regions during the definition of the polycrystalline silicon.

The technical problem underlying the present invention is that of devising a method for forming non-volatile memory cells, having such characteristics so as to allow the realization of floating gate regions extremely close with each other, thus overcoming the limitations that still affect the manufacturing methods according to prior art.

SUMMARY OF THE INVENTION

The present invention relates to a method for manufacturing non-volatile memory cells on a semiconductor substrate, comprising the following steps:
forming active areas in said semiconductor substrate, bounded by portions of an insulating layer;
depositing a first thin layer of tunnel oxide and a first layer of conductive material on said active areas; and
defining a plurality of floating gate (FG) regions.

Definition of the floating gate regions involves forming stripes of shielding material only above pairs of alternated active areas, by defining spacers of small width at will in the shelter of the side walls of the stripes thus defined, defining stripes of shielding material also on the active areas that lacked them and completing the formation of the floating gates by leaving the definition of the distance between floating gate regions to the spacers.

In accordance with one embodiment of the invention, a method is presented for semiconductor fabrication on a substrate including a plurality of active areas. First, a plurality of first stripes are formed by photolithographic techniques over a base polysilicon layer above even ones of the plurality of active areas. Next, a plurality of second polysilicon. stripes are formed without the use of photolithographic techniques over the base polysilicon layer above odd ones of the plurality of active areas. The first and second stripes may then be used as a hard mask through etching to define floating gate regions in the base polysilicon layer. The first and second stripes may be formed of either polysilicon or oxide material.

In accordance with another embodiment of the invention, a method is presented for semiconductor fabrication. A plurality of first stripes are formed over a base polysilicon layer above first alternating active areas. Sidewall spacers for the plurality of first stripes are then formed. Next, a plurality of second stripes are formed between the sidewall spacers over the base polysilicon layer above second alternating active areas. Lastly, the sidewall spacers are removed. The first and second stripes may then be used as a hard mask through etching to define floating gate regions in the base polysilicon layer. The first and second stripes may be formed of either polysilicon or oxide material.

In accordance with another embodiment of the invention, a method is presented for semiconductor fabrication. A plurality of stripes are formed over an insulated base polysilicon layer which lie above first alternating active areas. Sidewall spacers for the plurality of stripes are then formed. The stripes are removed, leaving the sidewall spacers in place. An oxide layer is then formed over the insulated base polysilicon layer between the sidewall spacers. Lastly, the sidewall spacers are removed. The oxide layer may then be used as a hard mask through etching to define floating gate regions in the base polysilicon layer.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1A:
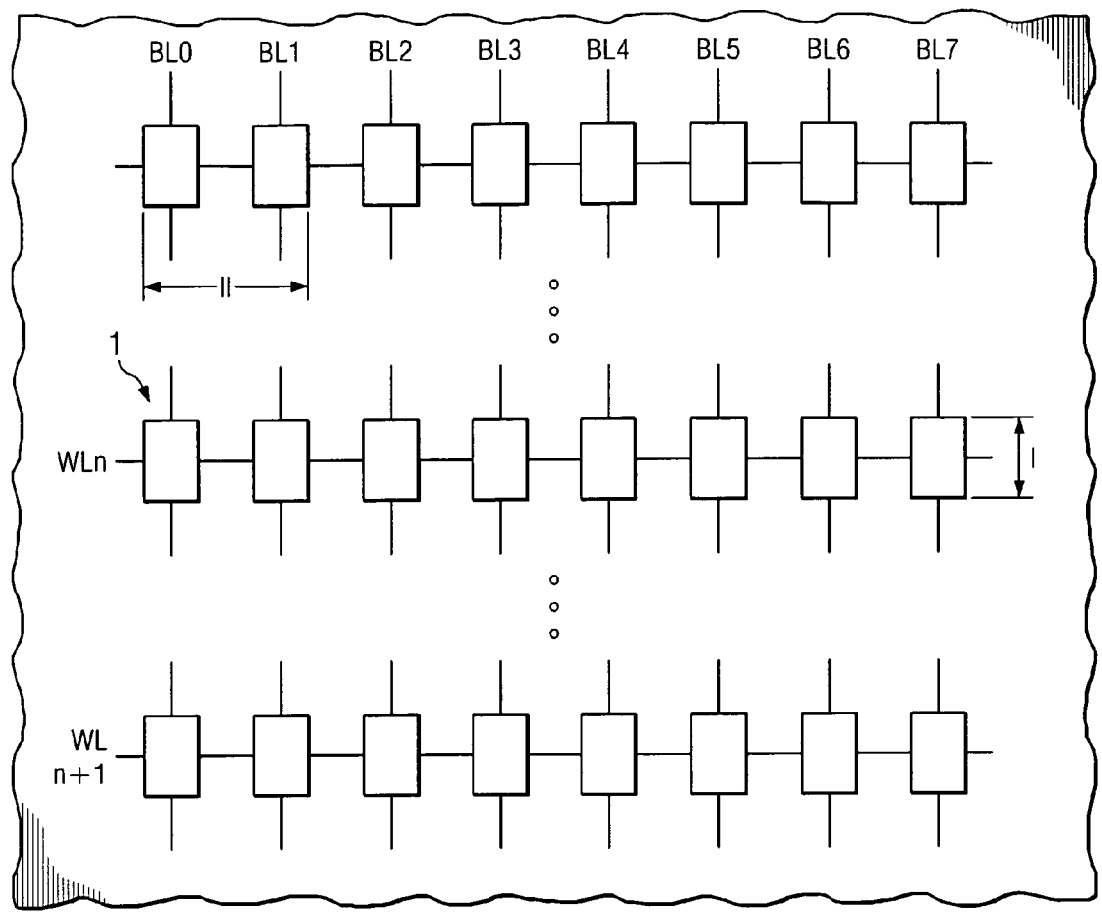
FIG. 1a shows a schematic view of a portion of memory cell matrix in an electronic memory device integrated on semiconductor.
Figure 1B:
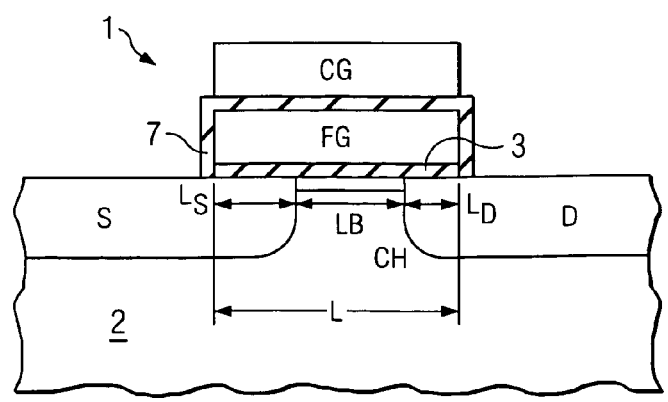
FIG. 1b is a sectional view along the line I—I of FIG. 1a of a conventional memory cell.
Figure 1C:
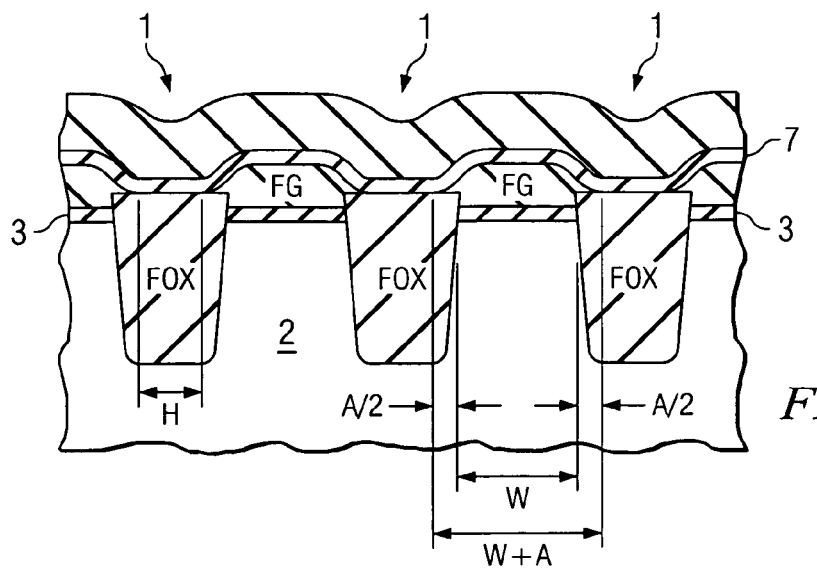
FIG. 1c is a sectional view along the line II—II of FIG. 1a of a conventional memory cell.
Figure 2:
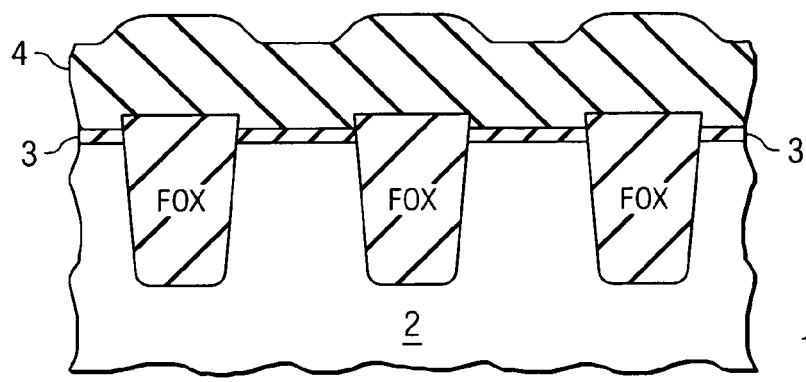
FIGS. 2–5 show respective enlarged vertical sections of a portion of a semiconductor substrate of a method for manufacturing non-volatile memory cells according to prior art.
Figure 3:
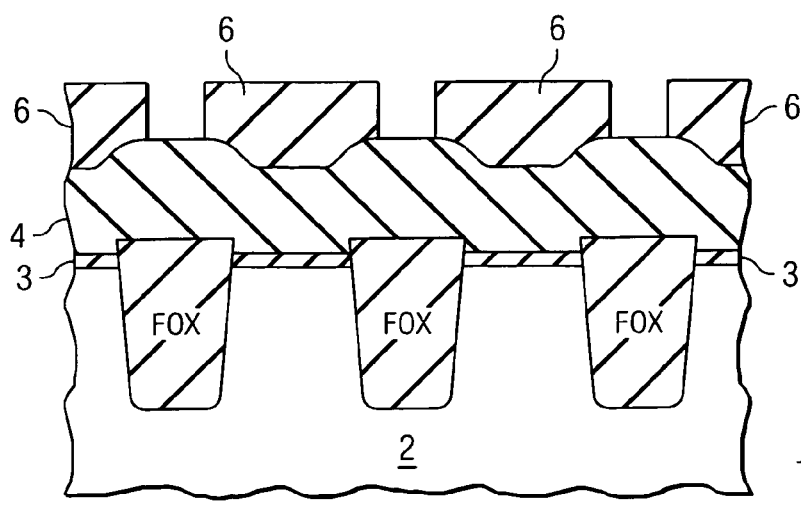
Figure 4:
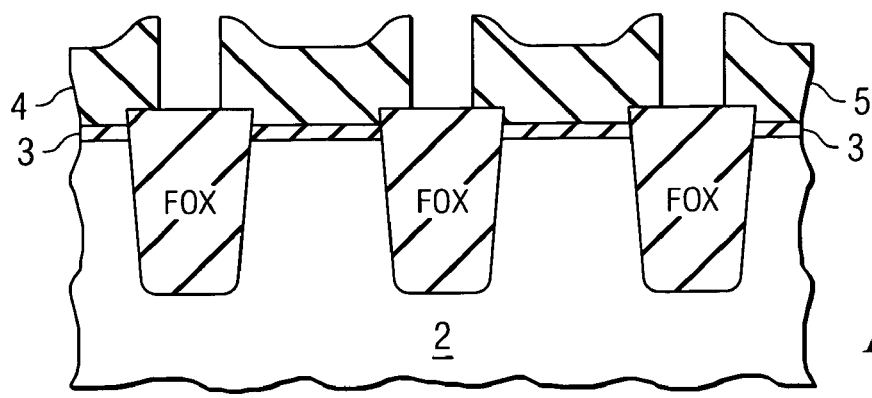
Figure 5:
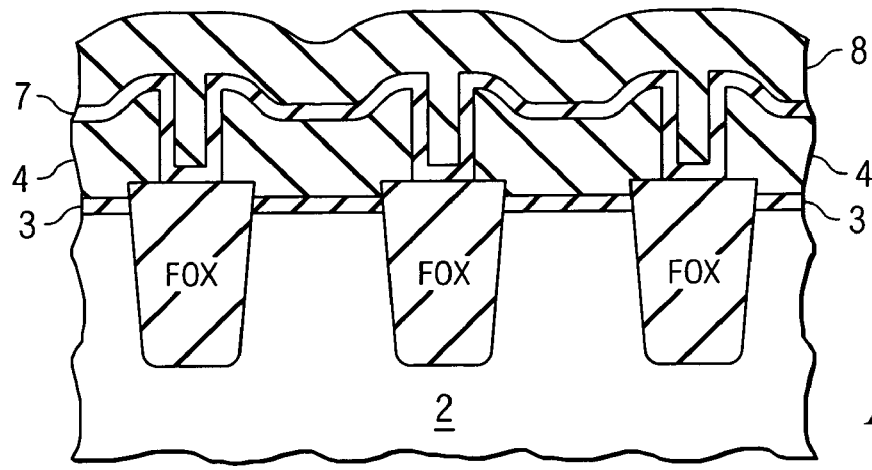

The method steps described hereafter do not form a complete process flow for manufacturing integrated circuits. The present invention can be put into practice together with the techniques for manufacturing integrated circuits currently used in the field, and, in the description, only those commonly used method steps are included being necessary for understanding the present invention.

The figures representing schematic or sectional views of portions of an integrated circuit during manufacturing are not drawn to scale, but only schematically in order to show the essential characteristics of the present invention. In the figures the same reference numbers will be given to structural elements being identical or equivalent from the functional point of view.

With reference to FIGS. 6–10, the method for realizing a memory cell 1 according to the invention will now be described.

On a substrate 2 a plurality of active areas is conventionally realized, wherein the memory cells 1 will be realized being separated from each other by portions of a field oxide layer FOX. On the substrate 2 a first dielectric layer 3 called "Tunnel Oxide" having thickness of 8–12 nm and a first polycrystalline silicon layer 4 called POLY1 constituting the floating gate are then conventionally formed.

This first polycrystalline silicon layer 4, whose thickness is of around 150–200 nm, is for example formed by means of LPCVD (Low Pressure Chemical Vapor Deposition). The first polycrystalline silicon layer 4 is possibly doped in order to reduce its resistivity, e.g., with either a phosphorous or arsenic implant or in situ by adding a suitable material (e.g., phosphine) to the depositing environment.

The method goes on with the deposition of a dielectric thin layer 7, i.e., interpoly oxide, on the first polycrystalline silicon layer 4 and so with the deposition of a second polycrystalline silicon layer 8, called POLY2 on the thin interpoly layer 7.

The deposition of the thin interpoly oxide layer 7 can occur by means of CVD (Chemical Vapor Deposition) techniques, in this case the thickness of such thin layer 7 is of 5–30 nm, or by depositing a layered structure of the ONO type. The second polycryistalline silicon layer 8 has instead a thickness similar or higher than that of the first polycrystalline silicon layer 4, usually about 150–350 nm.

Figure 6:
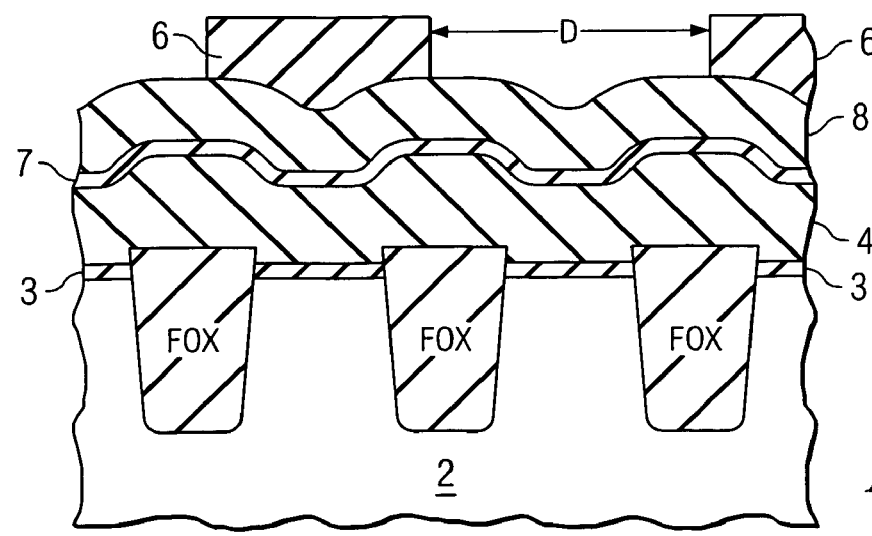
FIGS. 6–11 show respective enlarged vertical sections of a portion of a semiconductor substrate during realization of the method for manufacturing non-volatile memory cells according to the invention.

Then the floating gate regions of the cells 1 are defined. To this aim, the second polycrystalline silicon layer 8 is defined with a suitable defining mask in order to leave stripes 10 of the second polycrystalline silicon layer 8 on pairs of active areas (for example, even areas) —each bounded by two FOX oxide field portions,—alternated by an active area (for example odd areas) whereon no stripe of the second polycrystalline silicon layer 8 is left (FIG. 6).

The definition is realized by depositing a resist layer 6 on the second polycrystalline silicon layer 8 and so by means of conventional lithographic techniques, by impressing and developing the resist layer 6 in order to expose portions of the second polycrystalline silicon layer 8 of a first width D.

Through a selective etching, e.g., plasma etching, the polycrystalline silicon stripes 10 are then defined in the arrangement above indicated separated from each other by means of openings with width equal to the first width D.

Figure 7:
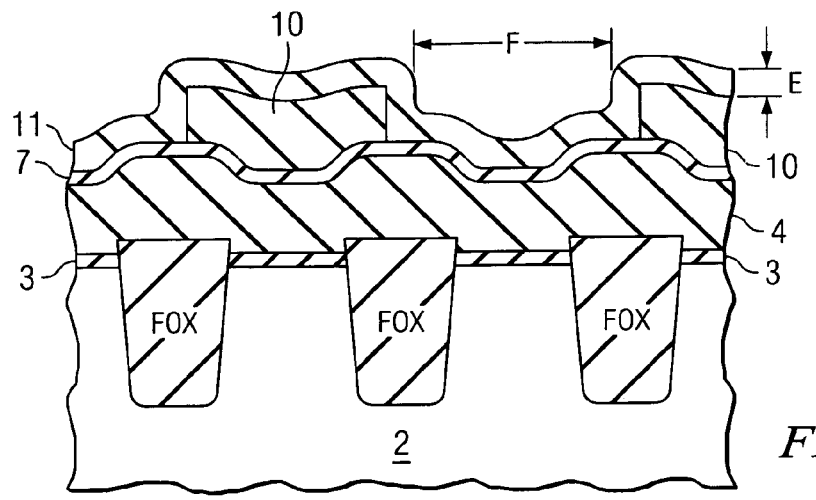

The method according to the invention now goes on with the deposition of a film or layer 11 of selective material (e.g. silicon nitride) selectively with respect to the interpoly oxide layer 7 and to the second polycrystalline silicon layer 8 and of thickness E, generally with LPCVD techniques (FIG. 7). In this way, openings between the polycrystalline silicon stripes 10 are defined having a second width equal to F=D−2E. Since the thickness of this film of selective material determines the final size of the poly-poly spacing its value can vary according to the requirements of the method; typically it is located between 20 nm and 120 nm.

By regulating the thickness of the film 11 of selective material, the width of the spacing between the floating gate regions FG is regulated, as it will be clearly shown hereafter, going down far below the minimum lithographic sizes being attainable by means of conventional techniques.

Figure 8:
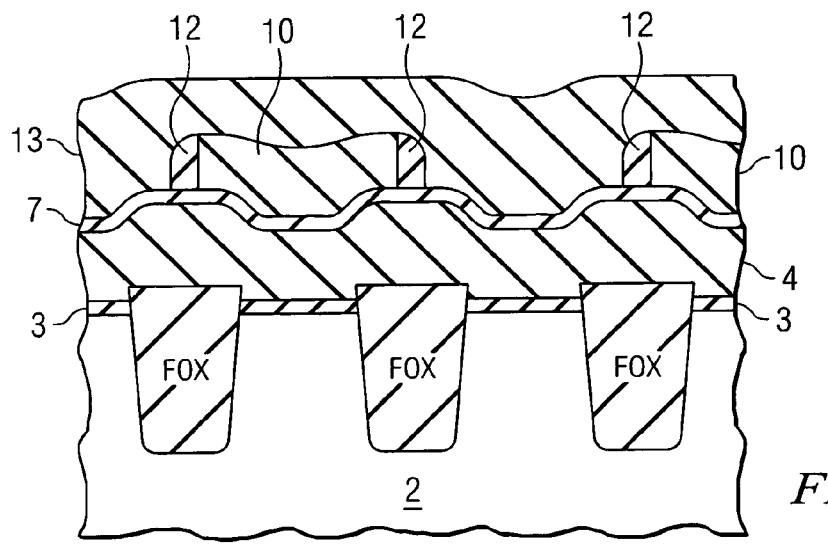

At this point, the layer 11 of selective material thus undergoes an anisotropic etching in order to form a spacer 12 next to the walls of the polycrystalline silicon stripes 10 (FIG. 8). The oxide layer 7 acts as stopping layer for dry etching the layer of selective material.

Figure 9:
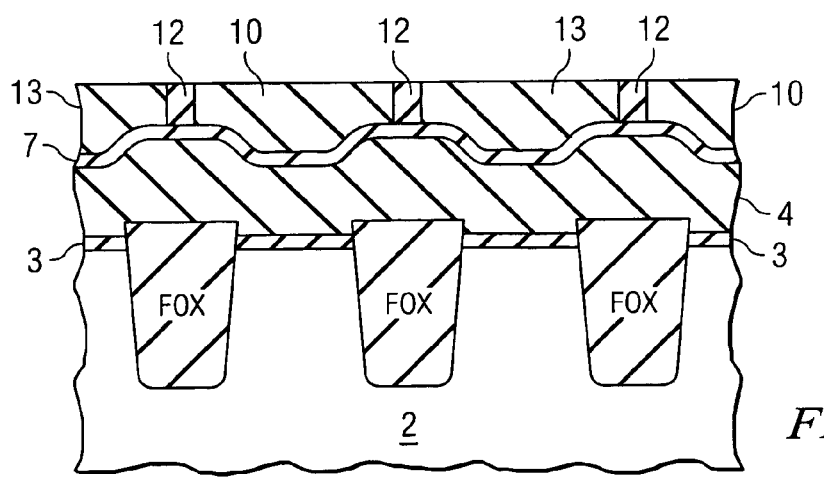

It is important that the spacer 12 of section of selective material has a rectangular form (FIG. 9). Since the form of this spacer 12 will be the same as that of the space between the floating gate regions FG, it is necessary to avoid having a dangerous oblique profile because this could generate residues in the subsequent etchings.

Figure 10:
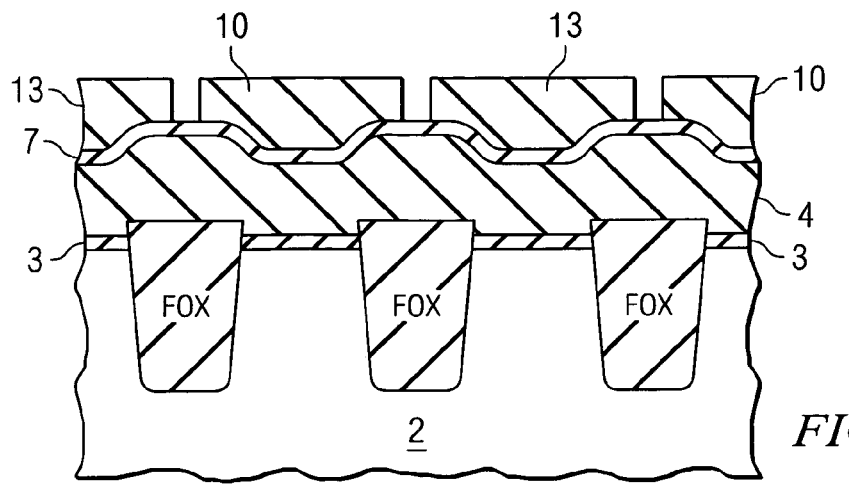

In order to reach this aim, the method according to the invention now goes on by depositing, by means of the above described techniques, a third polycrystalline silicon layer 13 having a thickness of 200–400 nm (FIG. 8). Afterwards, the third polycrystalline silicon layer 13 is planarized by means of either CMP or etch back (FIG. 9) up to a thickness of around 70–80 nm (lower than the thickness of the first polycrystalline silicon layer 4 and of the spacer 12 as schematized in FIG. 8). The left over spacer 12 of selective material (FIG. 9) is then selectively removed by means of a dry etching, or more simply by means of a wet etching in phosphoric acid solution, and the underlying interpoly oxide layer 7 by means of a dry etching until portions of the first polycristalline silicon layer 4 are exposed (FIG. 10).

Figure 11:
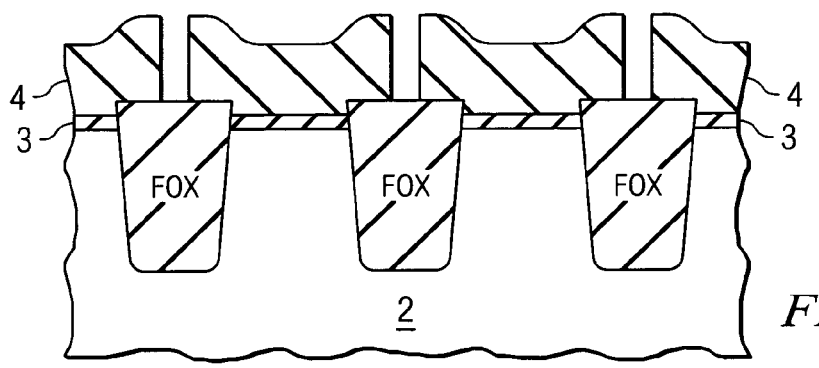

The second 10 and the third 13 polycrystalline silicon layers thus patterned then constitute a mask (hard mask) and they consume themselves during the subsequent etching of the first polycrystalline silicon layer 4 in order to define the floating gate region FG. Also in this case, the oxide layer 7 is used as stopping layer of the etching in order not to damage the surface of the floating gate region FG and to allow an extended over-etch so as to eliminate possible residues; it is removed when etching is finished by means of a dry or wet etching, if there is no intention to use it as part of the interpoly dielectric (FIG. 11).

With this method sequence the lithographic limitations of the previously described method according to the prior art are brilliantly overcome by defining stripes with predetermined size and at a reciprocal distance D much higher than the minimum available lithography.

With reference to FIGS. 12–18, the method according to a second embodiment of the invention is now described.

In accordance with such method, a first doped oxide layer 16 (e.g., PSG) is now deposited on the first polycrystalline silicon layer 4 by means of CVD techniques.

The thickness of the first doped oxide layer 16 is comprised between 30 and 150 nm.

Figure 13:
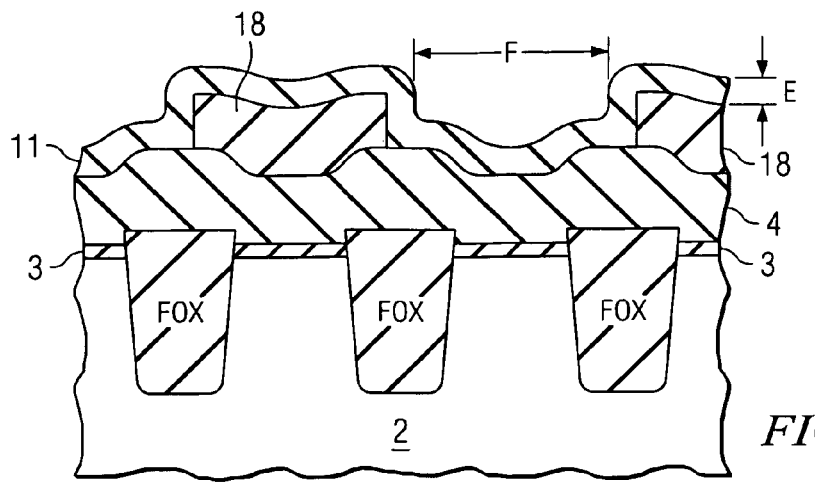

Then the first doped oxide layer 16 is defined with a suitable definition mask in order to leave stripes 18 of the first doped oxide layer 16 on pairs of active areas (for example, even areas)—each bounded by two portions of FOX field oxide—alternated by an active area (for example, odd areas) whereon no stripe of the first doped oxide layer 16 is left (FIG. 13).

Figure 12:
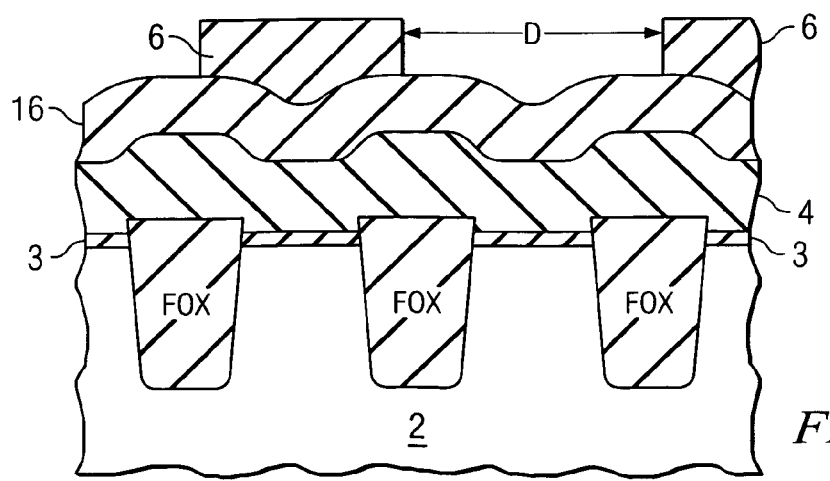
FIGS. 12 to 18 show respective enlarged vertical sections of a portion of a semiconductive substrate of a second embodiment of a method for manufacturing non-volatile memory cells according to the invention.

The definition is realized by depositing a resist layer 6 on the first doped oxide layer 16 and then by means of conventional lithographic techniques, by impressing and developing the resist layer 6 in order to expose portions of the first doped oxide layer 16 of a first width D (FIG. 12).

By means of a selective etching, e.g. a plasma etching, the doped oxide stripes 18 are then defined in the above indicated arrangement separated one another by means of openings with width equal to the first width D.

The method according to the invention now goes on with the deposition of a film or layer 11 of selective material (e.g., silicon nitride) with respect to the first doped oxide layer 16 and to the first polycrystalline silicon layer 4 and of thickness E, generally by means of LPCVD techniques (FIG. 13). In this way, openings between the doped oxide stripes 18 are defined having a second width equal to F=D−2E. Since the thickness of this film or layer of selective material determines the final size of the poly-poly spacing its value can vary according to the requirements of the method; typically it is located between 20 nm and 120 nm.

By varying the thickness of the layer 11 of selective material, the width of the spacing between the floating gate regions FG is regulated, as it will be clearly shown hereafter, going down far below the minimum lithographic sizes being attainable by means of conventional techniques.

Figure 14:
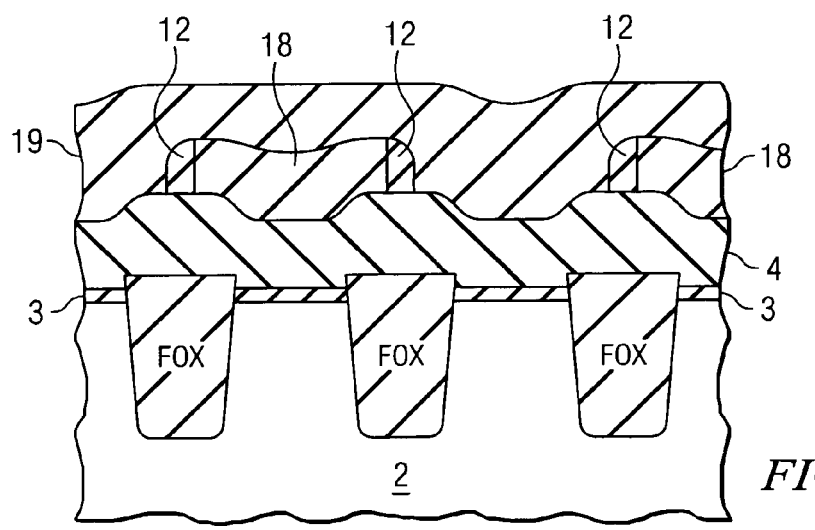
Figure 15:
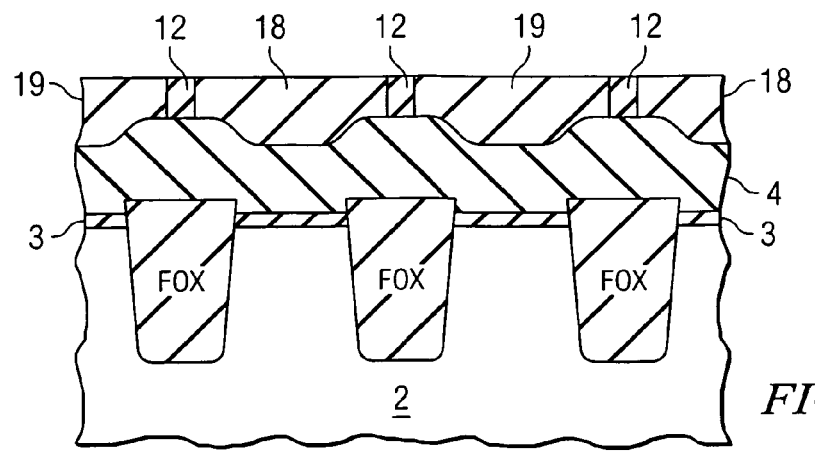

At this point, the layer 11 of selective material thus undergoes an anisotropic etching in order to form a spacer 12 next to the walls of the doped oxide stripes 18 (FIG. 14).

The method according to the invention then goes on by depositing, by means of the above cited techniques, a second doped oxide layer 19 having a thickness of 200–300 nm (FIG. 14). Subsequently, the second doped oxide layer 19 is planarized by means of either CMP or etch back (FIG. 15) up to a thickness of around 30–50 nm (lower than the thickness of the first crystalline polysilicon layer 4 and of the spacer 12 as schematized in FIG. 15).

Figure 16:
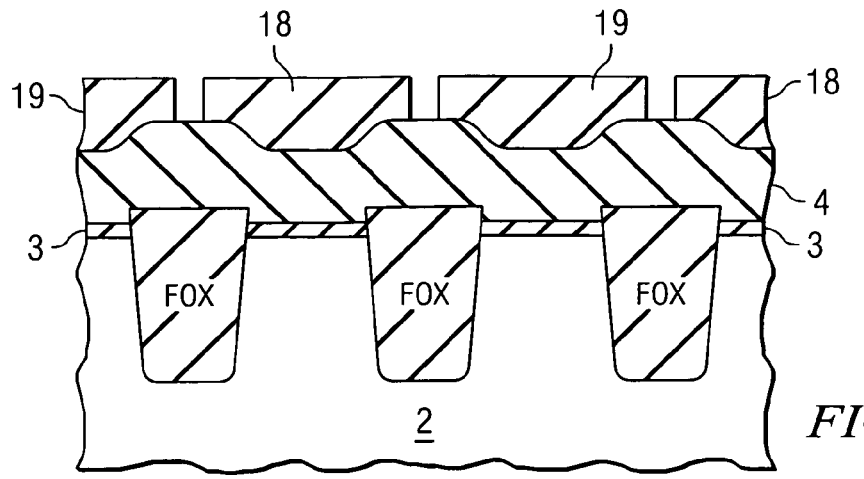

The left over spacer 12 of selective material is then selectively removed by means of a dry etching, or more simply by means of a wet etching in phosphoric acid solution (FIG. 16).

Figure 17:
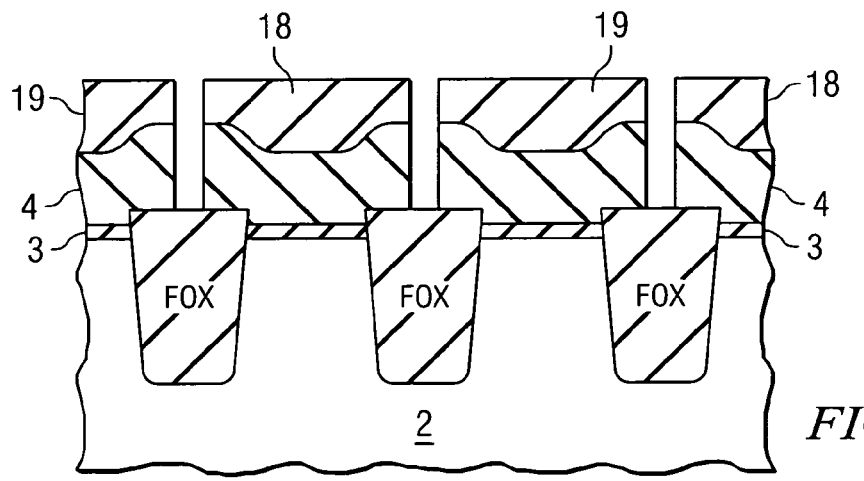
Figure 18:
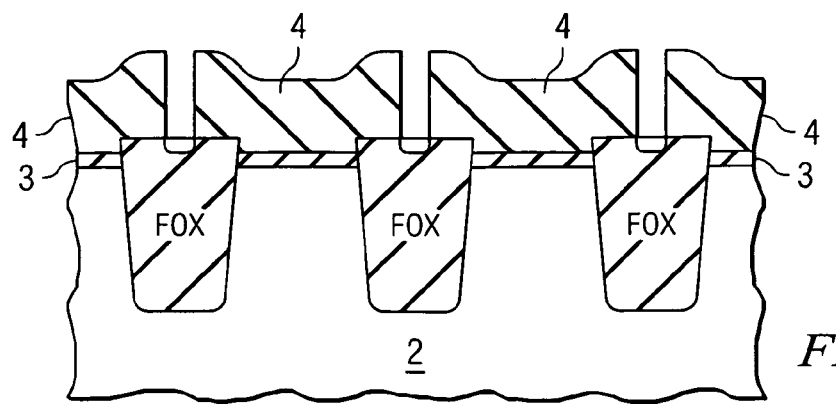

The first 18 and the second 19 doped oxide layers thus patterned then constitute a mask (hard mask) and they are used as a protection during the following etching of the first polycrystalline oxide layer 4, whose etching chemistry is strongly selective with respect to the silicon oxide (FIG. 17). In this way it is possible to define the floating gate region FG accurately. At the end of the etching of the first polycrystalline silicon layer 4, the first 18 and the second 19 doped oxide layers are removed by means of etching with a hydrofluoric acid solution (HF). Since the etching speed of the doped oxide is various times higher than the one related to the non-doped oxide, when the PSG film has been completely removed the insulating oxide is consumed during this operation in a negligible amount (FIG. 18).

With reference to FIGS. 19–25, the method to realize a memory cell 1 is now described according to a third embodiment of the invention.

On a substrate 2 a plurality of active areas is realized in a conventional way wherein memory cells 1 will be realized separated one another by portions of an oxide field layer FOX. On the substrate 2 a first dielectric layer 3 called "Tunnel Oxide", a first polycrystalline silicon layer 4 called POLY1 constituting the floating gate, an oxide layer 7 and a second polycristalline silicon layer 8 are then formed in sequence.

The first 4 and the second 8 polycristalline silicon layers are deposited by means of LPCVD technique and each of them has a thickness of 50–250 nm.

The oxide layer 7 is deposited by means of LPCVD techniques (e.g., according to TEOS or HTO technique) and it has a thickness of 10–20 nm.

Figure 19:
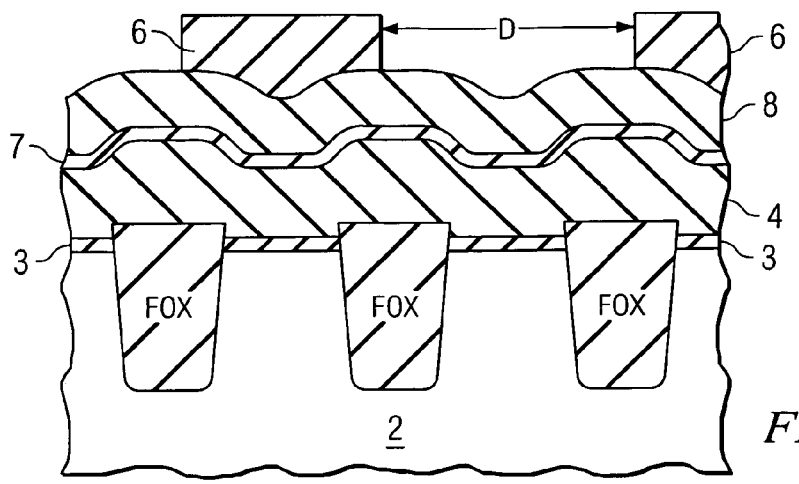
FIGS. 19 to 25 show respective enlarged vertical sections of a portion of a semiconductive substrate of a third embodiment of a method for manufacturing non-volatile memory cells according to the invention.

Then the second polycrystalline silicon layer 8 is defined by means of a suitable defining mask in order to leave stripes 10 of the second polycrystalline silicon layer 8 on pairs of active areas (for example, even areas—each bounded by portions of field oxide FOX) alternated by an active area (for example, odd areas) whereon no stripe of the second polycrystalline silicon layer 8 is left (FIG. 19).

The definition is realized by depositing a resist layer 6 on the second polycrystalline silicon layer 8 and so by means of conventional lithographic techniques, by impressing and developing the resist layer 6 in order to expose portions of the second polycrystalline silicon layer 8 of a first width D.

By means of a selective etching, e.g., plasma etching, the polycrystalline silicon stripes 10 are then defined in the arrangement above indicated separated one another by means of openings with widths being equal to the first width D.

Figure 20:
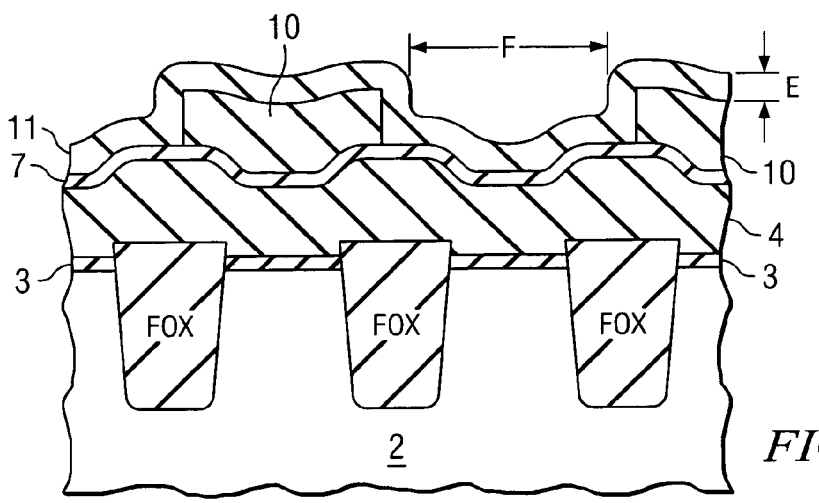

The method according to the invention now goes on with the deposition of a film or layer 11 of selective material (e.g., silicon nitride) with respect to the oxide layer 7 and to the second polycrystalline silicon layer 8 and of thickness E, generally by means of LPCVD techniques (FIG. 20). In this way, openings are defined between the polycrystalline silicon stripes 10 having a second width equal to F=D−2E. The thickness of this film of selective material determines the final size of the poly-poly spacing.

Figure 21:
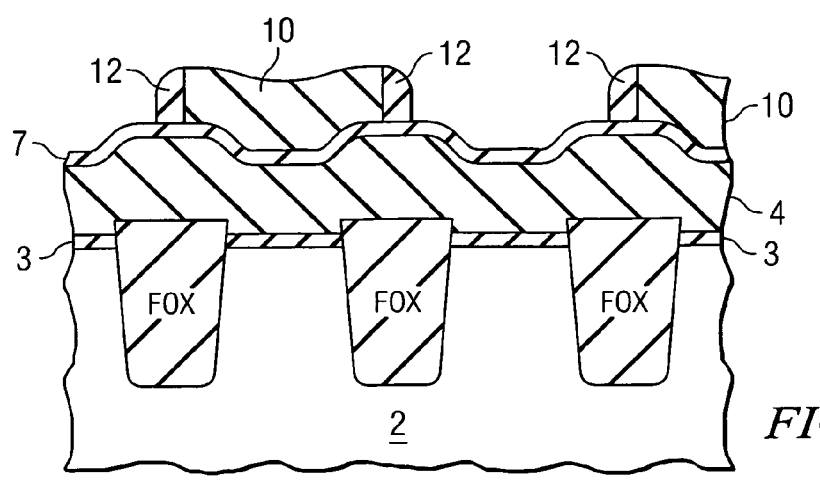

At this point, the film of selective material then undergoes an anisotropic etching in order to form a spacer 12 next to the walls of the polycrystalline silicon stripes 10 (FIG. 21). The oxide layer 7 acts as stopping layer for dry etching the selective film.

The polycrystalline silicon stripes 10 are then removed by means of a dry or in wet solution etching (e.g., HF based) so as to leave only the spacers 12 of selective material.

Figure 22:
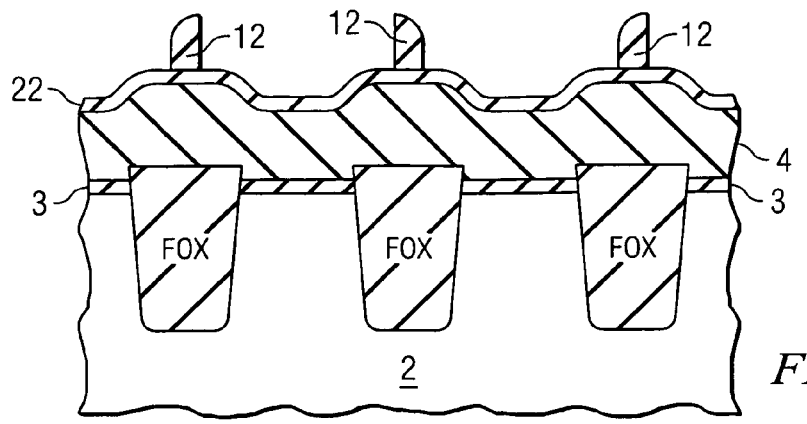

Now the method goes on by growing up a thermal oxide layer 22 having thickness of 30–50 nm in the exposed areas of the first polycrystalline silicon layer 4, i.e., not covered by the spacers 12 of selective material (FIG. 22). This growing process is carried out in oven in an environment rich in $O_2$ and $H_2O$ at a temperature between 700° C. and 900° C.

Figure 23:
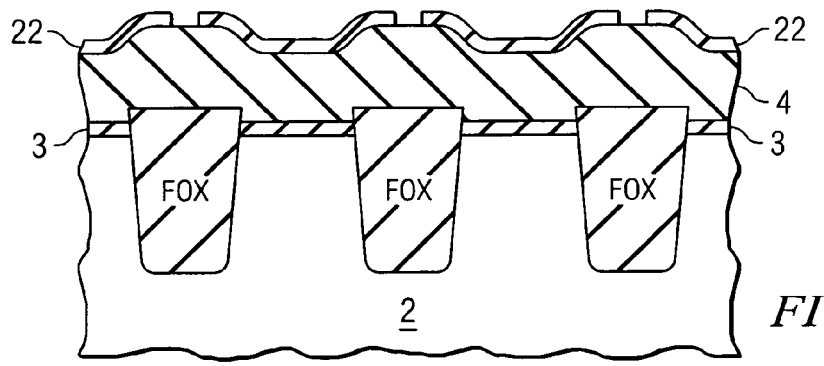
Figure 24:
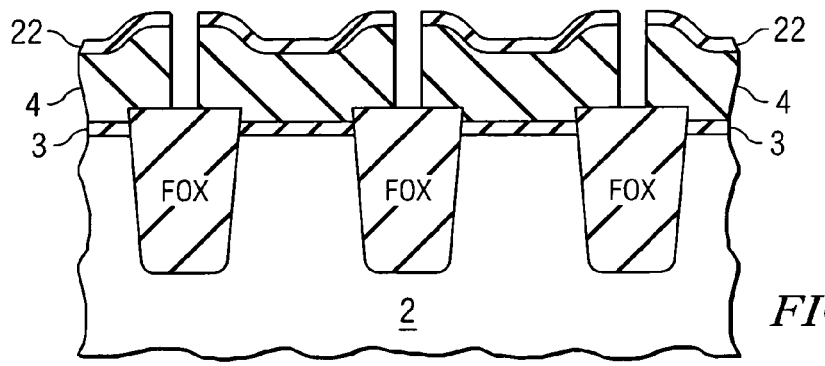
Figure 25:
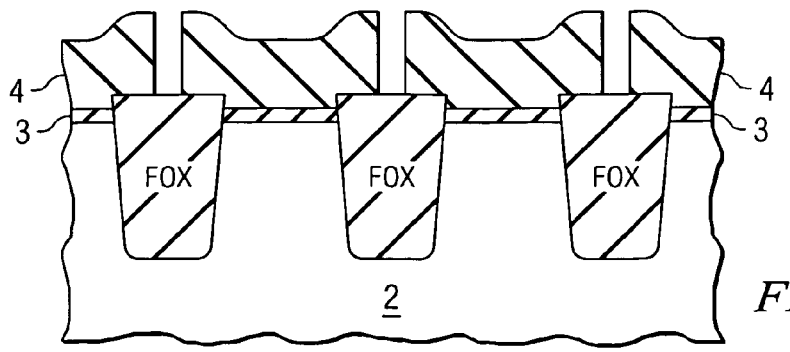

The spacers 12 of selective material are now selectively removed by means of a wet etching with phosphorous acid and the residue oxide layer 7 underlying the spacers 12 of selective material is removed by means of a wet etching (BOE or HF). The removing speed of an oxide being thermally grown up (the layer 22) and of a deposited oxide through LPCVD (the layer 7) is notably different; this, together with the difference of thickness between the two layers, allows to remove the thin oxide layer 7 underlying the spacers 12 of selective material without completely consuming the oxide layer 22 grown up on the exposed areas of the polycrystalline silicon (FIG. 23). The oxide layer 22 thus patterned is used as mask (hard mask) during the etching of the first polycrystalline silicon layer 4 by exploiting the selectivity of the poly etching with respect to the oxide (FIG. 24) and it is then removed with a preferably dry etching at the end of the definition of the floating gate region (FIG. 25).

In the method according to the invention, after defining the floating gate regions FG, the process flow goes on with the formation of the interpoly dielectric, which allows sealing of the POLY1, and of the second polysilicon layer, called POLY2. The cell is then defined by means of standard etching and photolithographic techniques.

The main advantage of this invention is the possibility of sizing the poly-poly spacing, also beneath the minimum sizes attainable by means of lithography, by only regulating the thickness of the nitride silicon layer deposited on the poly.

This allows an excellent size control both intra-wafer and intra-die.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for manufacturing non-volatile memory cells on a semiconductive substrate, comprising at least the following steps:
    forming active areas in said semiconductive substrate, bounded by portions of an insulating layer;
    forming a first thin layer of tunnel oxide and depositing a first layer of conductive material on said active areas;
    defining a plurality of floating gate regions, wherein the definition of the floating gate regions comprises the steps of:
        forming a plurality of alternated stripes of a first material above active areas alternated by active areas lacking stripes;
        forming spacers of a second material in the shelter of the side walls of said stripes, said second material being selectively etchable with respect to said first material,
        depositing a layer of a third material in order to fill in the space between said spacers,
        polishing said layer of a third material together with said alternated stripes and said spacers to the same planar level,
        selectively removing said spacers in order to expose portions of said first layer of semiconductive material,
        etching said first layer of semiconductive material in order to form grooves in correspondence with its exposed portions,
        selectively removing said alternated stripes and said layer of a third material.

2. The method according to claim 1, wherein said first material and said third material are a conductive material.

3. The method according to claim 2, wherein said plurality of alternated stripes is formed by depositing a second layer of conductive material and by defining said second layer of conductive material by means of lithography.

4. The method according to claim 3, wherein between said first layer of semiconductive material and said second layer of semiconductive material a thin oxide layer is interposed.

5. The method according to claim 1, wherein said second material is silicon nitride and wherein the formation of said spacers in the shelter of the side walls of said alternated stripes comprises the deposition of a silicon nitride layer, which is patterned by means of an anisotropic etching.

6. The method according to claim 1, wherein said first material and said third material are each an oxide.

7. The method according to claim 6, wherein said plurality of alternated stripes is formed by depositing a first oxide layer and by defining said first oxide layer by means of lithography.

8. The method according to claim 7, wherein said second material is silicon nitride and wherein the formation of said spacers in the shelter of the side walls of said alternated stripes comprises the deposition of a silicon nitride layer, which is patterned by means of an anisothropic etching.

9. A method for manufacturing non-volatile memory cells on a semiconductor substrate, comprising:
    forming active areas in said semiconductor substrate, bounded by portions of an insulating layer;
    depositing a first thin layer of tunnel oxide and a first layer of conductive material on said active areas; and defining a plurality of floating gate regions, comprising:
  forming stripes of shielding material only above pairs of alternated active areas;
  defining spacers of small width in the shelter of the side walls of the stripes thus defined;
  defining stripes of shielding material also on the active areas that lacked them;
  polishing the stripes and spacers to the same planar level;
  removing the spacers to form openings; and
  etching the first layer of conductive material through the openings to form a plurality of gate regions.

10. A semiconductor fabrication method, comprising:
  forming a plurality of first stripes from a polysilicon material over an insulated base polysilicon layer and which lie above first alternating active areas;
  forming sidewall spacers for the plurality of first stripes;
  forming a plurality of second stripes from a polysilicon material between the sidewall spacers over the insulated base polysilicon layer which lie above second alternating active areas;
  chemically mechanically polishing the first stripes, second stripes and sidewall spacers to the same planar level; and
  removing the sidewall spacers.

11. The method according to claim 10, wherein forming the plurality of first stripes comprises:
  depositing a first polysilicon material layer;
  defining the first stripes in the first material layer using a photolithography mask;
  etching using the mask to remove the first material layer but leave the first stripes.

12. The method according to claim 10, wherein forming the plurality of second stripes comprises:
  depositing a second polysilicon material layer that covers the first stripes and fills a region between sidewall spacers.

13. The method according to claim 10, wherein forming sidewall spacers comprises:
  depositing a nitride layer; and
  patterning the nitride layer to remove the nitride layer above the second alternating active areas but leave the nitride layer adjacent sidewalls of the first stripes.

14. The method according to claim 10, further comprising:
  using the first and second stripes as a hard mask; and
  etching using the first and second stripes hard mask to define floating gate regions in the base polysilicon layer above both the first and second alternating active areas.

15. A method for semiconductor fabrication on a substrate including a plurality of active areas, comprising:
  forming a plurality of first polysilicon stripes by photolithographic techniques over an insulated base polysilicon layer and which lie above even ones of the plurality of active areas; and
  forming a plurality of second polysilicon stripes without the use of photolithographic techniques over the insulated base polysilicon layer and which lie above odd ones of the plurality of active areas;
  wherein the plurality of first and second polysilicon stripes have a polished upper surface at the same planar level.

16. The method of claim 15 wherein forming a plurality of first polysilicon stripes comprises:
  depositing a first polysilicon material layer;
  defining the first polysilicon stripes in the first material layer using a photolithography mask;
  etching using the mask to remove the first material layer but leave the first polysilicon stripes.

17. The method of claim 15 wherein forming the plurality of second polysilicon stripes comprises:
  forming sidewall spacers for the plurality of first polysilicon stripes;
  forming the plurality of second polysilicon stripes between the sidewall spacers over odd ones of the active areas; and
  removing the sidewall spacers.

18. The method of claim 15 wherein forming the plurality of second polysilicon stripes comprises:
  forming sidewall spacers for the plurality of first polysilicon stripes;
  depositing a second polysilicon material layer that covers the first polysilicon stripes and fills a region between the sidewall spacers;
  chemically mechanically polishing to remove the second material layer but leave the second polysilicon stripes such that the first and second polysilicon stripes have the polished upper surface at the same level.

19. The method according to claim 15, wherein forming sidewall spacers comprises:
  depositing a nitride layer; and
  patterning the nitride layer to remove the nitride layer above odd ones of the active areas but leave the nitride layer adjacent sidewalls of the first polysilicon stripes.

20. The method according to claim 15, further comprising:
  using the first and second polysilicon stripes as a hard mask; and
  etching using the first and second polysilicon stripes hard mask to define floating gate regions in the base polysilicon layer above both the odd and even ones of the active areas.

* * * * *